United States Patent
Roy et al.

(10) Patent No.: US 11,199,774 B2
(45) Date of Patent: Dec. 14, 2021

(54) METHOD AND APPARATUS TO IMPROVE FRAME CURE IMAGING RESOLUTION FOR EXTRUSION CONTROL

(71) Applicant: CANON KABUSHIKI KAISHA, Tokyo (JP)

(72) Inventors: Nilabh K. Roy, Austin, TX (US); Anshuman Cherala, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 113 days.

(21) Appl. No.: 16/835,039

(22) Filed: Mar. 30, 2020

(65) Prior Publication Data
US 2021/0302829 A1 Sep. 30, 2021

(51) Int. Cl.
| | |
|---|---|
| *G03F 7/00* | (2006.01) |
| *H04N 9/31* | (2006.01) |
| *G02B 27/00* | (2006.01) |
| *G02B 26/08* | (2006.01) |
| *B82Y 10/00* | (2011.01) |

(52) U.S. Cl.
CPC ....... *G03F 7/0002* (2013.01); *G02B 26/0833* (2013.01); *G02B 27/0025* (2013.01); *H04N 9/3114* (2013.01); *B82Y 10/00* (2013.01)

(58) Field of Classification Search
CPC .............. G03F 7/0002; G02B 26/0833; G02B 27/0025; H04N 9/3114
See application file for complete search history.

(56) References Cited

U.S. PATENT DOCUMENTS

| | | | |
|---|---|---|---|
| 5,912,773 A | 6/1999 | Barnett et al. | |
| 6,476,986 B2 | 11/2002 | Smith et al. | |
| 9,952,440 B2 | 4/2018 | Matsumoto | |
| 9,971,249 B1 | 5/2018 | Barnesberger et al. | |
| 2017/0285331 A1 | 10/2017 | Miyaharu et al. | |
| 2017/0358478 A1* | 12/2017 | Thothadri | H01L 25/0753 |
| 2020/0376775 A1* | 12/2020 | Das | B29C 35/08 |
| 2021/0191256 A1* | 6/2021 | Cherala | B81C 1/0046 |

OTHER PUBLICATIONS

Nilabh K. Roy et al., U.S. Appl. No. 16/661,281, filed Oct. 23, 2019.
(Continued)

*Primary Examiner* — Hung Nguyen
(74) *Attorney, Agent, or Firm* — Canon U.S.A., Inc. IP Division

(57) ABSTRACT

A frame cure apparatus includes a position actuator and a controller. The position actuator is attached to a digital spatial modulator (DSM) having a plurality of spatial elements with a pitch, and configured to move the DSM with a step size less than the pixel pitch to provide a pattern for curing a photo-curable material in a desired curing region on a substrate. The controller moves the DSM with the step size in a predefined sequence that covers a first curing region and a second curing region such that a first curing dose accumulated at the first curing region exceeds a curing threshold while a second curing dose accumulated at the second curing region does not exceed the curing threshold. The predefined sequence provides the set of curing patterns. The first curing region matches the desired region. The second curing region does not match the desired curing region.

27 Claims, 8 Drawing Sheets

(56) References Cited

OTHER PUBLICATIONS

Chi Zhou, Yong Chen; "Additive Manufacturing based on Optimized Mask Video Projection for Improved Accuracy and Resolution;" Proceedings of 39th North American Manufacturing Research Conference of Society of Manufacturing Engineers, 2011, vol. 39, pp. 125-134, Society of Manufacturing Engineers, Dearborn, MI.
Andrew J. Fleming, Adrian G. Wills, Ben S. Routley; "Exposure Optimization in Scanning Laser Lithography;" IEEE Potentials Jul./Aug. 2016, pp. 35(4):33-39, IEEE, Piscataway, NJ, 2016.
Japanese Patent Application No. 2019-047613, filed Mar. 14, 2019, to publish sometime after Sep. 2020.

* cited by examiner

METHOD AND APPARATUS TO IMPROVE FRAME CURE IMAGING RESOLUTION FOR EXTRUSION CONTROL

BACKGROUND

Field

One disclosed aspect of the embodiments relates to nanoimprint lithography. In particular, one disclosed aspect of the embodiments relates to techniques to improve frame cure resolution for extrusion control.

Description of the Related Art

Extrusion formation at the mesa edges is a major obstacle in nanoimprint lithography for volume production. Existing techniques to prevent extrusion formation at the mesa edges include techniques that selectively cure the photo-curable material along the edges of the field before ultraviolet (UV) curing starts. One efficient implementation of these techniques is curing using Digital Micromirror/Mirror Device (DMD).

The DMD is an optical micro-electrical-mechanical system (MEMS) that contains an array of highly reflective micro mirrors. Specially designed optics are used to provide accurate curing. However, due to the statistical nature of the optical beams and problems in the current optics design, curing at precise locations accurately and repeatably remains a challenge. Currently, the curing resolution is dependent upon the DMD pixel size, pixel pitch and the magnification of the setup from DMD to the wafer plane. The smallest achievable curing resolution is currently 65 µm per pixel. This curing resolution is not adequate to precisely cure the regions along the edges.

SUMMARY

A frame cure apparatus includes a position actuator and a controller. The position actuator is attached to a digital spatial modulator (DSM) having a plurality of spatial elements with a pitch, and configured to move the DSM with a step size less than the pitch to provide a pattern for curing a photo-curable material in a desired curing region on a substrate. The controller moves the DSM with the step size in a predefined sequence that covers a first curing region and a second curing region such that a first curing dose accumulated at the first curing region exceeds a curing threshold while a second curing dose accumulated at the second curing region does not exceed the curing threshold. The predefined sequence provides the set of curing patterns. The first region matches the desired curing region. The second region does not match the desired curing region.

Further features of the disclosure will become apparent from the following description of exemplary embodiments with reference to the attached drawings.

DESCRIPTION OF THE EMBODIMENTS

One disclosed aspect of the embodiments includes a technique to perform curing with accuracy in nanoimprint lithography using a template. A frame cure apparatus includes a position actuator and a controller. The position actuator is attached to a digital spatial modulator (DSM) having a plurality of spatial elements with a pitch, and configured to move the DSM with a step size less than the pitch to provide a set of curing patterns for curing a photo-curable material in a desired curing region on a substrate. The desired curing region is part of a plurality of curing regions having outer edges or boundaries correlated, matched, or aligned with the mesa sidewalls of the template. The controller moves the DSM with the step size in a predefined sequence that covers a first curing region and a second curing region such that a first curing dose accumulated at the first curing region exceeds a curing threshold, while a second curing dose accumulated at the second curing region does not exceed the curing threshold. In addition, each of the non-accumulated curing doses at the individual curing patterns does not exceed the curing threshold. The predefined sequence provides the set of curing patterns. The first curing region matches the desired curing region. The second curing region does not match the desired curing region.

Figure 1:
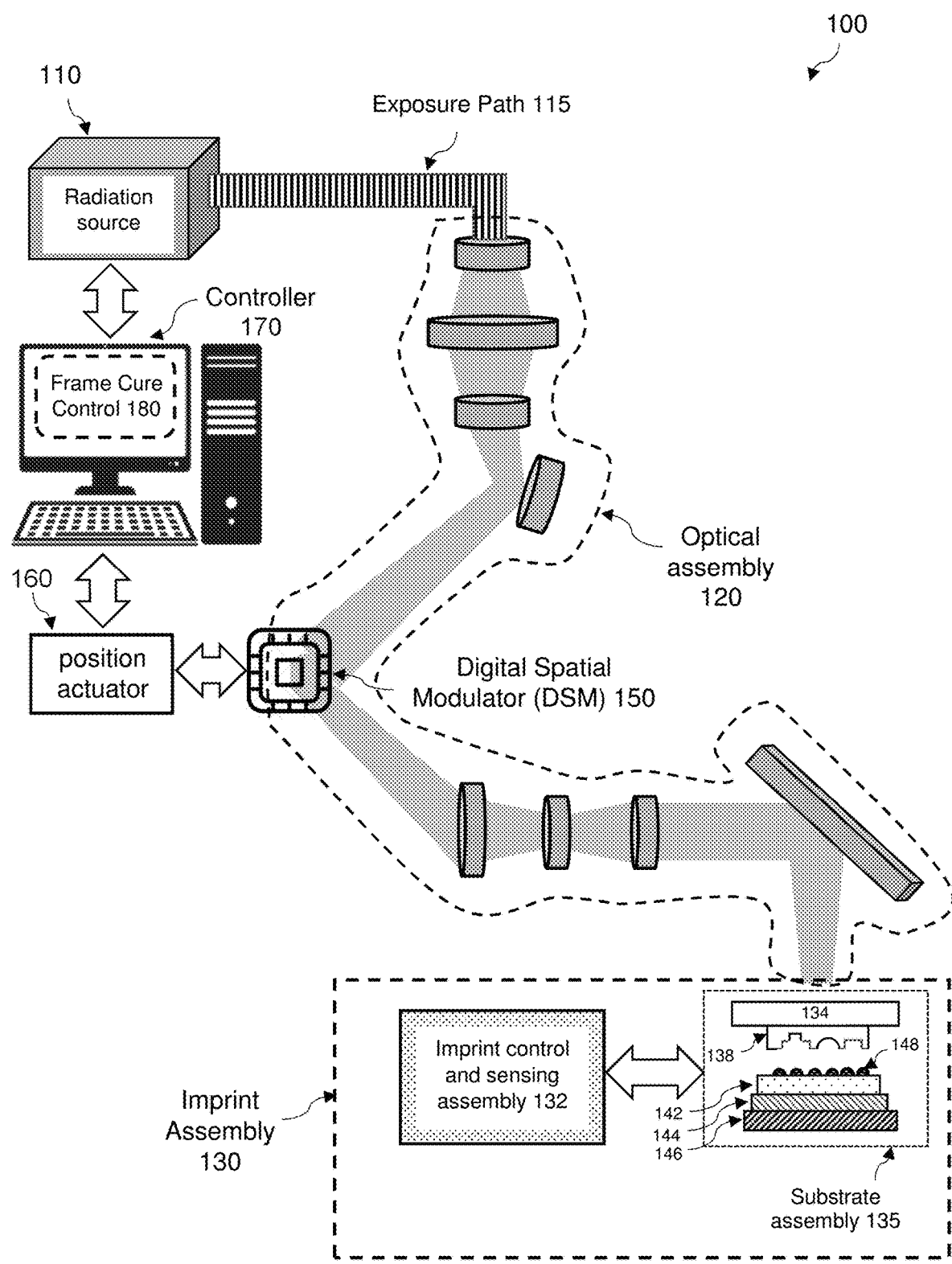
FIG. 1 is a diagram illustrating a system for frame cure control.

FIG. 1 is a diagram illustrating a system for frame cure control or a frame cure apparatus in imprint lithography. The system 100 includes a radiation source 110, an optical assembly 120, an imprint assembly 130, a digital spatial modulator (DSM) 150, a position actuator 160, and a controller 170. The system 100 may include more or less than the above components.

The radiation source 110 radiates actinic energy for curing through an exposure path 115. The energy source may be ultra-violet (UV) light. In one embodiment, the radiation source 110 may include two sources: one is modulated by the DSM 150 and exposes the edges, and one provides energy to the center. In one embodiment, the two sources provide energy at different wavelengths which have different curing efficiencies. In one embodiment, energy from the two sources may overlap in space and/or time at the photo-curable material plane. The optical assembly 120 receives the light energy at the end of the exposure path and directs the energy through a system of optical components to irradiate the photo-curable material in the imprint assembly 130 via the DSM 150. It may include lenses that are designed and positioned at positions to achieve the proper modulation for the light source. The optical assembly 120 may magnify the pattern in the DSM 150 by a magnification factor prior to projecting the pattern on the substrate in the substrate assembly 130.

The imprint assembly 130 includes components used for nanoimprint lithography. It includes a control and sensing assembly 132 and a substrate assembly 135. The control and sensing assembly 132 performs control and sensing functions for the imprinting on the substrate. It may include a field camera to provide images of the spread of the formable material and to keep track of the imprinting process, a droplet inspection system to inspect droplets. The substrate assembly 135 may include a template 134 having a template pattern 138, a substrate 142, a substrate chuck 144, a substrate positioning stage 146 that holds the substrate chuck 144 and the substrate 142 on which a patterned layer is formed. The template 134 may be made from a material such as quartz, silicon, organic polymers, or other suitable materials. The template pattern 138 includes features that have recesses and protrusions corresponding to the pattern to be formed on the substrate 142. In an alternative embodiment, the template pattern 138 is featureless which is used to form a planarized surface on the substrate 142. The substrate 142 may be coated with a thin adhesion layer to help in the adhesion to the photo-curable material after curing. It may be held by the substrate chuck 144 and both are positioned on the stage 146. The stage 150 may be controlled by the processing and control system 170 to move the substrate and substrate chuck assembly. The photo-curable material 148 is used to transfer the template pattern 138 to the semiconductor substrate 142 in the substrate assembly 135. It may be a resist and include a formable material that takes on an inverse of shapes on a patterning surface from a mold and/or a template. The photo-curable material 148 may be cured by the energy provided by the radiation source. In an embodiment, after the photo-curable material 148 is cured additional semiconductor manufacturing processing is may be performed on the substrate 142 in a processing step so as to create an article of manufacture (e.g. semiconductor device). In an embodiment, each field includes a plurality of devices. The further semiconductor manufacturing processing in the processing step may include etching processes to transfer a relief image into the substrate that corresponds to the template pattern 138 in the patterned layer or an inverse of that template pattern 138. The further processing in the processing step may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

The DSM 150 is a device that contains an array of spatial elements to modulate the spatio-temporal distribution of the actinic radiation from the radiation source 110. The DSM 150 may also modulate the spatio-temporal distribution of the thermal radiation from a thermal radiation source (not shown) which may be used to cause the thermal expansion of one or both of the substrate and template. The spatial elements may be arranged in a two-dimensional array with a pitch, which is the smallest distance between centers of two adjacent spatial elements. As an illustrative example, suppose the translation resolution of the positional actuator 160 is 1 μm. When the optical assembly has a magnification factor of 4.82, the resulting curing edge shifting resolution on the wafer plane will be equal to the product of the translation resolution and the magnification factor, 1 μm×4.82=4.82 μm, which is 15 times smaller than the current curing shifting resolution of 65 μm. In one embodiment, the DSM is a digital micromirror device (DMD). The spatial elements are the pixels and the pitch is the pixel pitch. In an alternative embodiment, the DSM is a transmissive liquid crystal device in which the transmissivity of each of the spatial elements is adjustable. In an alternative embodiment, the DSM is a reflective liquid crystal on silicon device in which the reflectivity of each of the spatial elements is adjustable.

The positional actuator 160 is attached to the DSM 150 and is configured to move the DSM 150 with a step size that is less than the pitch to provide a pattern for curing the photo-curable material 148 in a desired curing region on the substrate 142. The position actuator 160 moves the DSM 150 in discrete steps in either horizontal (or x) direction, vertical (or y) direction, or both horizontal and vertical (or x and y) directions. The position actuator 160 may include a receptacle to hold the DSM 150. The receptacle may be driven by a drive circuit or a micrometer drive which may include a motorized actuator with micron, sub-micron, or sub-nano resolution.

The controller 170 is coupled to the position actuator 160 to move the DSM with the step size in a predefined sequence. The controller 170 may include circuits and applications or software module for frame cure control 180 to control the position actuator 160 and/or the radiation source 110. The predefined sequence is a predetermined sequence of positions or movements that covers a first curing region and a second curing region of curing. The first curing region matches the desired curing region and the second curing region does not match the desired curing region. The first curing region and the second curing region correspond to a first curing dose and a second curing dose, respectively. The first curing dose is the curing dose that is accumulated at the first curing region and it exceeds a curing threshold. The second curing dose is the curing dose that is accumulated at the second curing region and it does not exceed the curing threshold.

Figure 2:
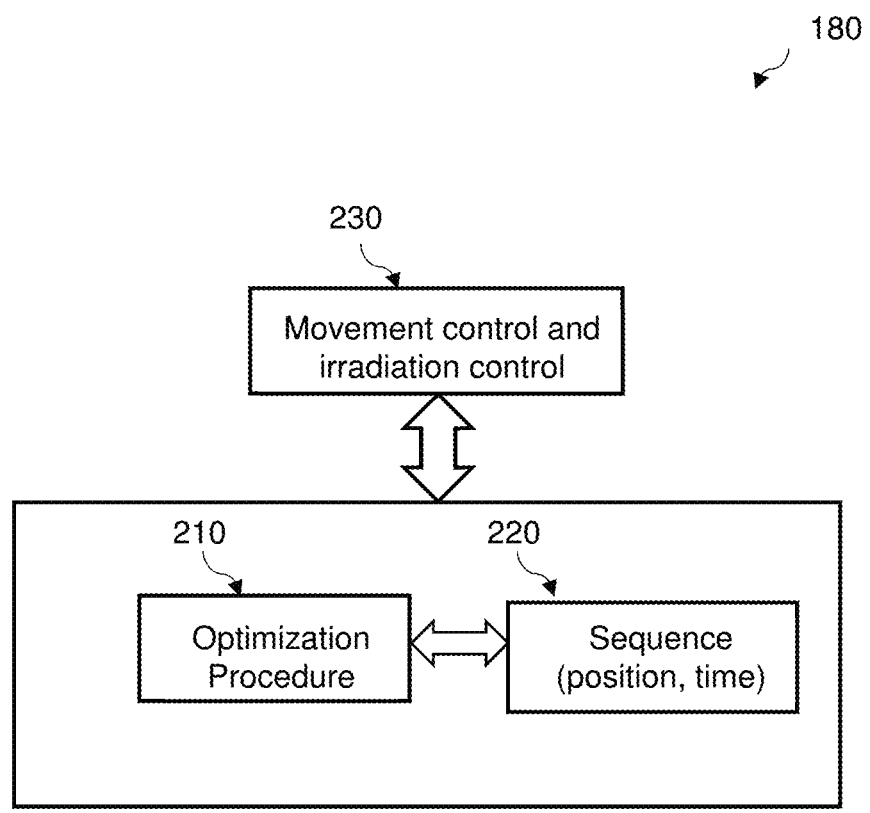
FIG. 2 is a diagram illustrating a module for frame cure control.

FIG. 2 is a diagram illustrating a module for frame cure control 180 shown in FIG. 1. The module frame cure control 180 includes an optimization procedure 210, a sequence 220, and a movement control and irradiation control 230. The optimization procedure 210 implements an optimization process that determines a sequence of positions or movements that would produce the desired curing region under a pre-defined optimal condition. Any suitable optimization algorithm may be employed including minimum mean square error (MMSE), gradient descent, etc. The sequence 220 is a sequence of exposure curing patterns, their relative positions or movements and their exposure durations to provide a curing region that matches the desired curing region and whose accumulated curing dosage exceeds a curing threshold. The curing threshold is a threshold above which the curing dosage is deemed sufficient for curing the photo-curable material. The sequence 220 is a pre-determined sequence and is typically computed off-line and downloaded to a storage or memory to be used in the movement control and irradiation control 230. The movement control and irradiation control 230 controls the position actuator 160 and the radiation source 110. The control may include the drive control of the microdrive of the position actuator 160, the switching of the radiation, and the time to turn on or turn off the radiation.

Figure 3:
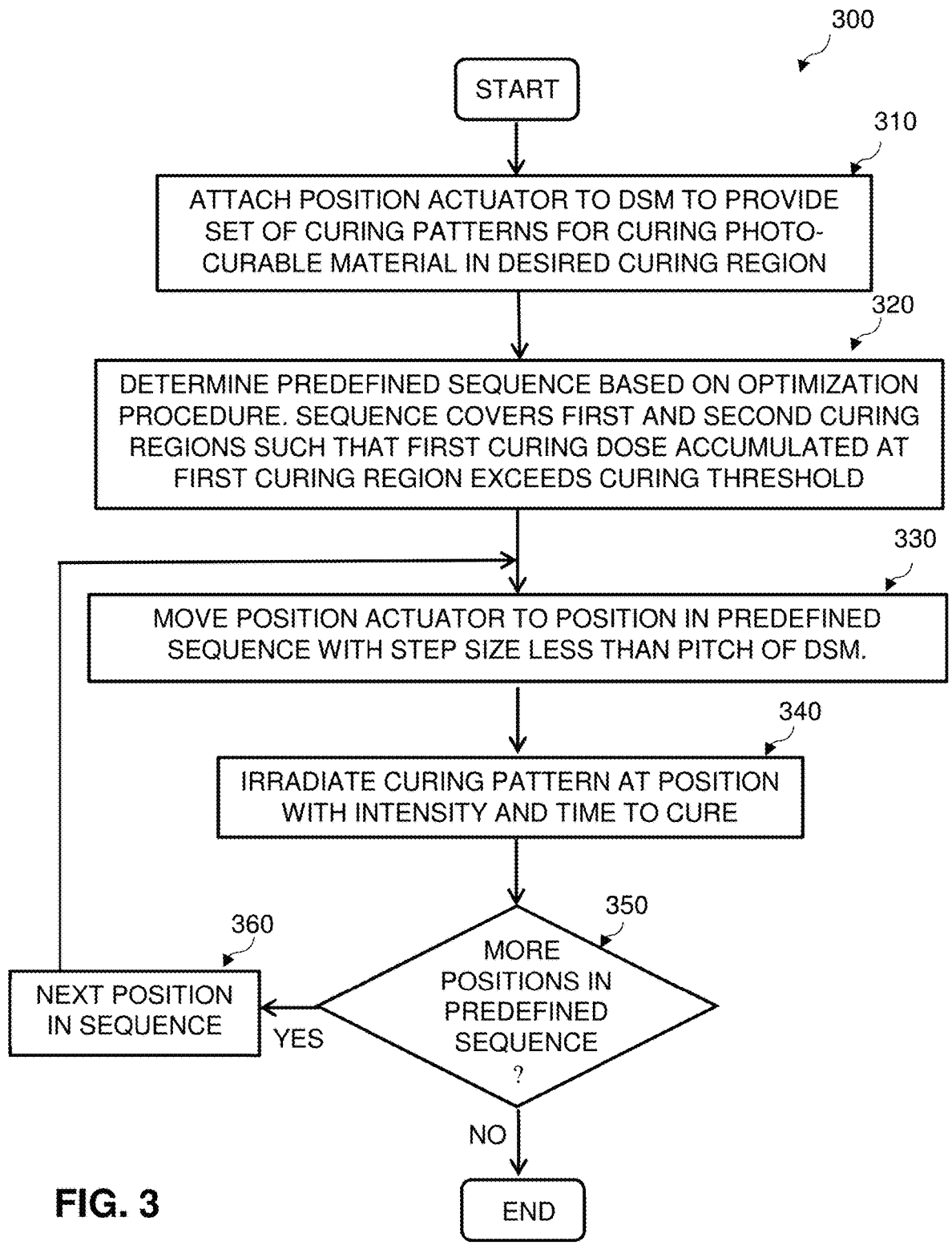
FIG. 3 is a flowchart illustrating a process for frame cure control.

FIG. 3 is a flowchart illustrating a process 300 for frame cure control. The process 300 may be performed by a central processing unit (CPU) in the controller 170 in executing a program or instructions.

Upon START, the process 300 attaches the position actuator 160 to the DSM 150 to provide pattern or a set of curing patterns for curing the photo-curable material in the desired curing region (Block 310). Typically this operation is performed once at the factory for each position actuator attachment. Then, the process 300 determines the predefined sequence 220 using the optimization procedure 210 shown in FIG. 2 (Block 320). This sequence covers an entire curing region which includes the desired curing region. The entire curing region includes a first curing region in which the accumulated first curing dose exceeds a curing threshold. The first curing region matches the desired curing region. When a set of curing patterns is used, the curing patterns in the set may be slightly different depending on the result of the optimization algorithm. At each iteration, a pattern from the set of curing patterns is employed or presented for curing. Typically, blocks 310 and 320 are performed off line prior to the real-time curing process.

Then, in a real-time mode, the process 300 moves the position actuator 160 to a position in the predefined sequence with a step size less than the projected pitch of the DSM 150 on the photo-curable material plane (Block 330). This movement may be performed by a translation in horizontal (x) direction only, vertical (y) direction only, or x and y directions. Next, the process 300 irradiates the currently used pattern at the position with an intensity and time duration as provided in the predetermined sequence to cure the photo-curable material (Block 340). Then, the process 300 determines if there are more positions in the predefined sequence (Block 350). If Yes, the process 300 obtains the next position in the predefined sequence (Block 360) and returned to Block 330. Otherwise, the process 300 is terminated.

Figure 4:
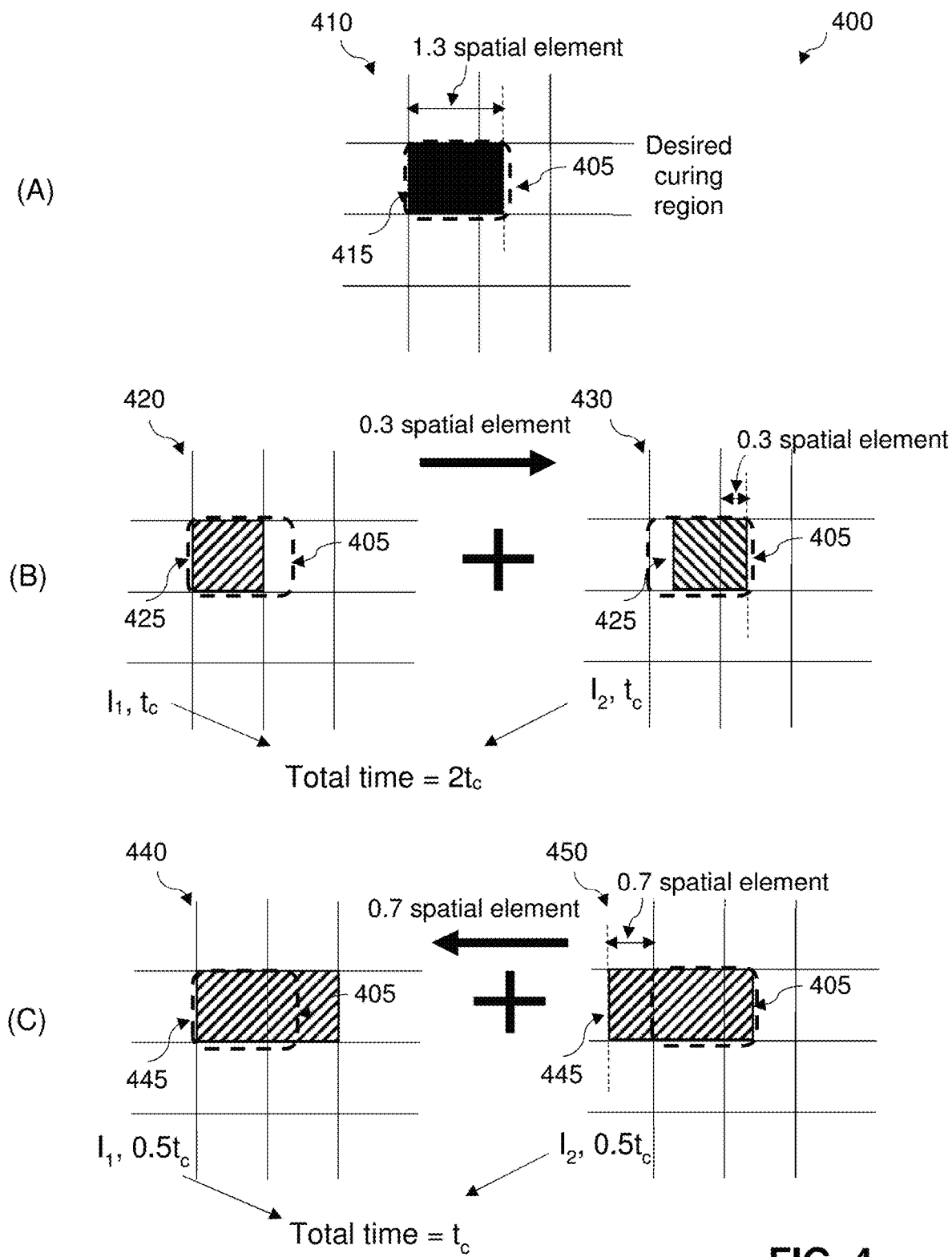
FIG. 4 is a diagram illustrating an example for fine resolution curing using multiple curing patterns.

FIG. 4 is a diagram illustrating an example 400 for fine resolution curing using multiple curing patterns. The example 400 includes three spatial element maps (A), (B) and (C). Each of the spatial element maps show a map of spatial elements in two dimensions. Spatial element map (A) illustrates the spatial element position 410. The spatial element position 410 includes a desired curing region 405 shown in dotted lines which covers a pattern 415 shown in solid black. The pattern 415 has a dimension of 1.3 spatial element in the horizontal direction (e.g., the x direction) and 1 spatial element in the vertical direction (e.g., the y direction).

Spatial element map (B) shows a sequence of positions 420 and 430 of the DSM that provides a curing region having a net curing dosage that exceeds the curing threshold corresponding to the desired curing region. The position 420 includes a spatial element 425 at an initial location and having a spatial element size of 1 spatial element in both horizontal and vertical directions. At this position, the curing intensity is $I_1$ and the curing time is $t_c$. The position 430 shows the DSM moves a distance corresponding to 0.3 times the pitch, to the right, thus causing the spatial element 425 to move a distance of 0.3 spatial element to the right. At this position, the curing intensity is $I_2$ and the curing time is $t_c$. The combination of the two positions corresponds to the desired curing region 405. The total curing time is $t_c+t_c=2 t_c$.

Spatial element map (C) shows a sequence of positions 440 and 450 of the DSM that provides a curing region having a net curing dosage that exceeds the curing threshold corresponding to the desired curing region. The position 440 includes a map 445 at an initial location and having a spatial element size of 2 spatial elements in the horizontal direction and 1 spatial element in the vertical direction. At this position, the curing intensity is $I_1$ and the curing time is 0.5 $t_c$. The position 450 shows the map 445 moves a distance of 0.7 spatial element to the left. At this position, the curing intensity is $I_2$ and the curing time is 0.5 $t_c$. The combination of the two positions corresponds to the desired curing region 405. The total curing time is 0.5 $t_c$+0.5 $t_c$=$t_c$. The spatial element map (C), therefore, represents a better throughput than the spatial element map (B) because it uses a more efficient sequence of positions and curing time.

It should be noted that the curing region that matches the desired curing region 405 includes overlapped subregions in position 440 and 450 as a result of the incremental movements of the DSM 150. The sum of intensities or curing dosages at these overlapped subregions exceeds the curing dosage threshold and therefore produces a successful curing. On the other hand, the subregions that are outside the desired curing region 405 do not accumulate sufficient curing doses for a successful curing.

Figure 5:
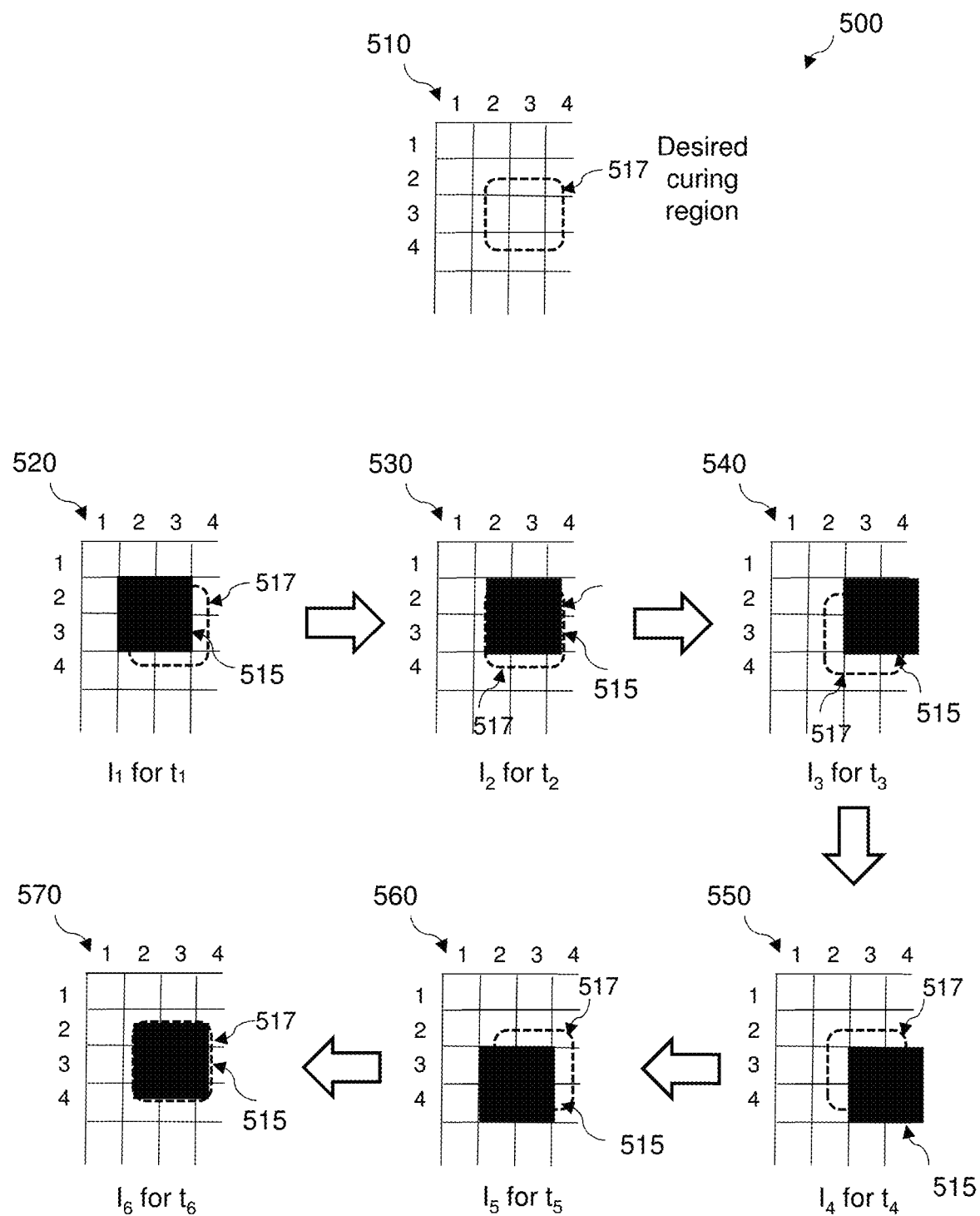
FIG. 5 is a diagram illustrating an example of an optimized sequence of pattern positions to achieve desired curing.

FIG. 5 is a diagram illustrating an example 500 of an optimized sequence of pattern positions to achieve a desired curing with sufficient energy and curing time $t_{curing}$. The example 500 includes a spatial element position 510 of a desired curing region 517. The coordinates (x, y) on the horizontal (x) and vertical (y) axes are shown for ease of reference. The desired curing region 517 is located at the coordinates (2,2).

The spatial element positions 520, 530, 540, 550, 560, and 570 show the sequence of positions that the DSM 150 is moved during the curing process. Note that while this example shows 6 positions, the sequence may include any number of positions from 1 to n where n is a positive integer. The sequence of these positions has been determined in advance by an optimization procedure. Each of the spatial element positions show a corresponding curing region 515 that is moved from the previous position with a step size smaller that the pitch of the DSM 150 at the photo-curable material plane. For ease of reference, the desired curing region 517 is shown in dotted lines.

At each position, the radiation source is controlled to provide an instantaneous intensity over a period, referred to as the curing time. The curing dosage is typically taken as a product of the intensity and the curing time. The higher the intensity is, the larger the curing dosage becomes. Similarly, the longer the time is, the larger the curing dosage. By selecting appropriate values for the intensity and the time duration at each position, an optimal sequence of spatial element maps and their corresponding positions or relative movements may be obtained such that an accumulating curing region that matches the desired curing region will have an accumulated curing dosage that exceeds a curing threshold corresponding to a successful curing dosage.

The spatial element position 520 is the initial position. At this position, the radiation source is controlled to provide an energy intensity of $I_2$ for a time duration of $t_1$. Then the DSM 150 is moved to the spatial element position 530. At this position, the intensity is $I_2$ and the time is $t_2$. Similarly, at position 540, the intensity is $I_3$ and the time is $t_3$; at position 550, the intensity is $I_4$ and the time is $t_4$; at position 560, the intensity is $I_5$ and the time is $t_5$; and at position 570, the intensity is $I_6$ and the time is $t_6$.

The curing times have been selected such that the total time does not exceed the desired curing time $t_{curing}$:

$$t_1+t_2+t_3+t_4+t_5+t_6=t_{curing} \qquad (1)$$

When the DSM is moved to the last position 570, the curing has been performed over an entire curing region in which several sub regions are overlapped and the curing energies are accumulated. The more overlapped layers at a location, the higher the accumulated curing dosage is applied at that location. The sequence of positions has been determined in advance such that there will be a first curing region matching the desired curing region within the entire curing region. In this first curing region, the curing dosages of the sub-regions have been sufficiently accumulated to exceed the curing dosage threshold. As mentioned earlier, the subregions in the first curing region may not have equal accumulated intensities or curing dosages due to irregular overlap curing patterns, but all of the accumulated intensities or curing dosages exceed the curing dosage threshold. The second curing region, which is outside the first curing region, does not have accumulated intensities or curing dosages exceeding the curing dosage threshold and therefore does not provide a successful curing.

Figure 6:
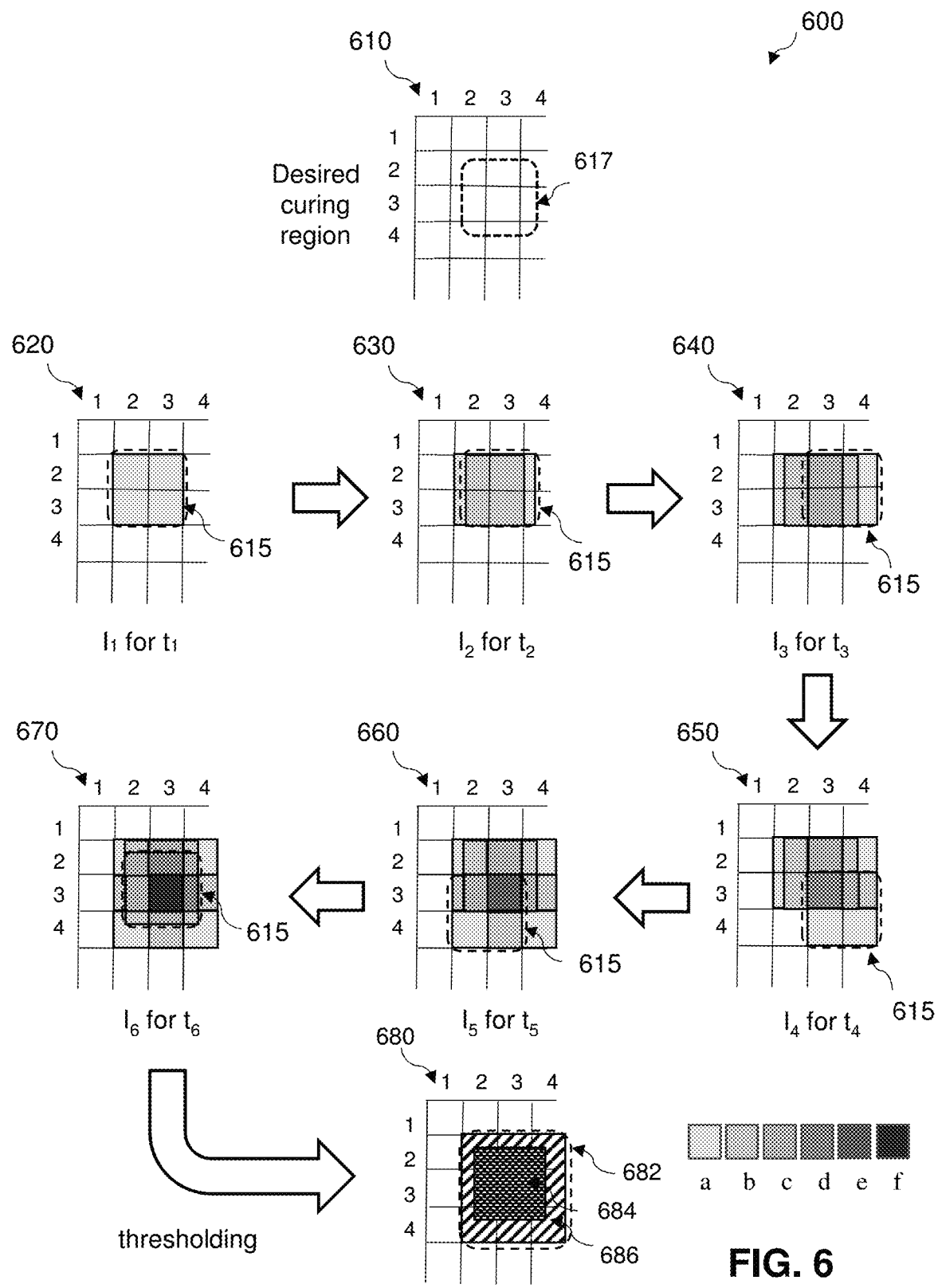
FIG. 6 is a diagram illustrating accumulation of energies to achieve curing at a desired curing region.

FIG. 6 is a diagram illustrating accumulation of energies to achieve curing at a desired curing region. FIG. 6 is similar to FIG. 5 with the additional information showing the accumulated curing dosages at the sub-regions. The dosage is shown with grey level ranging from light to dark. In this example, there will be 6 shades of grey level a, b, c, d, e, and f.

Similar to FIG. 5, the position 610 shows the desired curing region 617. The sequence of positions 620, 630, 640, 650, 660, and 670 corresponds to the sequence of positions 520, 530, 540, 550, 560, and 570, respectively. As the sequence moves from 620 to 670, an entire curing region 682 (shown in position 680) is exposed to the actinic radiation. Within this entire curing region 682, there are subregions that overlap with each other and therefore accumulate curing intensities though with different values. At the end of the sequence, a threshold operation is performed to binarize the entire curing region 682 into two curing regions: a first curing region 684 and a second curing region 686. The first curing region 684 has subregions with accumulated curing dosage exceeding the dosage threshold for curing and therefore delivers the correct curing. As noted earlier, while the first curing region 684 does not have a uniform distribution of accumulated intensities or curing dosages among its subregions, all of the accumulated intensities or curing dosages of the subregions in the first curing region 684 exceed the curing dosage threshold. On the other hand, the second curing region 686 has subregions with accumulated curing dosages that do not exceed the dosage threshold and therefore does not deliver the correct curing. The first curing region 684 matches the desired curing region 617. Accordingly, the result is that the curing can be performed with very fine resolution and precisely cure the curing regions along the edges to prevent extrusion formation.

The curing dose for the entire curing region 682 may be calculated by adding (or accumulating) the individual sub-regions:

$$Q = \Sigma I_i * t_i \quad (2)$$

where $\Sigma$ is taken from i=1 to n.

The $I_i$ and $t_i$ are selected or determined by the optimal sequence such that for the curing region that matches the desired curing region, Q>curing threshold; and for the curing region that does not match the desired curing region, Q≤curing threshold.

Figure 7:
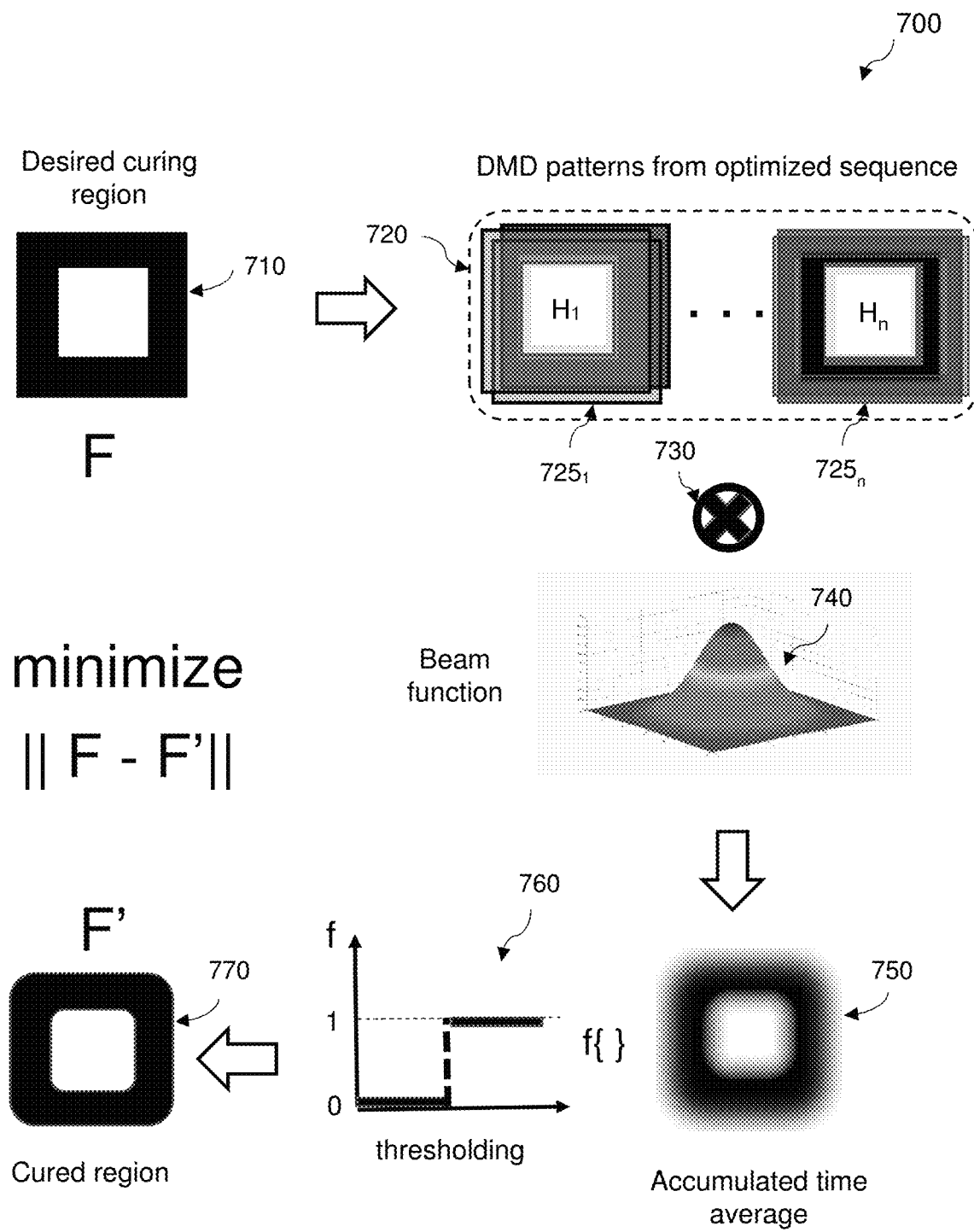
FIG. 7 is a diagram illustrating a mathematical sequence to provide the optimized sequence for curing.

FIG. 7 is a diagram illustrating a mathematical sequence to provide the optimized sequence for curing. The mathematical sequence illustrates the result of the curing using the optimized sequence.

Suppose the desired curing region is represented by F 710 a matrix representation of the desired cured region on the photo-curable material plane where the continuous X Y space is divided into discrete Cartesian coordinates and 1 unit on the X Y coordinate corresponds to the projected spatial element pitch (as an example, in this case 65 μm) on the photo-curable material plane. For example, F may represent a rectangle that corresponds to, or aligns at the boundaries with the, mesa sidewalls of a template in which each element $F_{i,j}$ of the map F is 1 or 0 ($F_{i,j} \in Z_2$) depending on whether the location corresponding to $F_{i,j}$ is supposed to be cured (1) or not cured (0) and in which the indexes i and j represent discretization of the photo-curable material plane along the x and y Cartesian axes. Similarly, the resulting cured region is represented by another matrix representation, F' 770. Suppose the optimal condition is minimum total absolute error between the desired cured region (F) and an actual cured region (F'). The optimization procedure involves finding a sequence of curing patterns $H_1$-$H_n$, each of which are translated in X or Y directions by the DSM actuator by different amounts such that the error between F and F' is minimized. In other words, the problem statement is to determine the sequence 720 to minimize ||F−F'||.

The sequence 720 includes finding n curing patterns $H_1$ $725_1$ (a matrix) to $H_n$ $725_n$ (also a matrix). The n curing patterns $H_1 \ldots H_n$ are spatial intensity curing patterns (DSM spatial element curing patterns) that need to be determined and their translation magnitudes and directions in X & Y. In another embodiment, the number of curing patterns i.e. n could be fixed to say 5 curing patterns to use (based on the memory to hold these curing patterns, computational cost to compute these curing patterns) and the translation magnitudes and their order in X and Y could be predetermined or fixed for lower computational complexity and faster solution times. In another embodiment, the translation magnitudes of the curing patterns is determined using the projected pitch magnitude and number of curing patterns to find for e.g. translation magnitudes (at the photo-curable material plane) in X and Y for 5 curing patterns with 65 μm projected spatial element pitch could be −0, ±65/5=13 μm, ±2*65/5=26 μm, ±3*65/5=39 μm, ±4*65/5=52 μm. In such cases, given these constraints number of curing patterns & predetermined translations & their orders, the purpose of optimization procedure is to find the spatial intensity distributions or DSM spatial element curing patterns $H_1 \ldots H_n$ to use that would minimize the errors between F and F'. The curing process may be modelled as a convolution of the curing patterns with a beam function 740. This beam function 740 models the process and may be a blurring function, a Gaussian function or any other suitable function that is representative of an intensity of the actinic radiation supplied at the plane of the photo-curable material during imprinting by a single spatial element of the DSM. The result is the summation of these convolutions which gives the result 750. The result 750 is then thresholded by a threshold function 760 and produces the final result 770.

Figure 8:
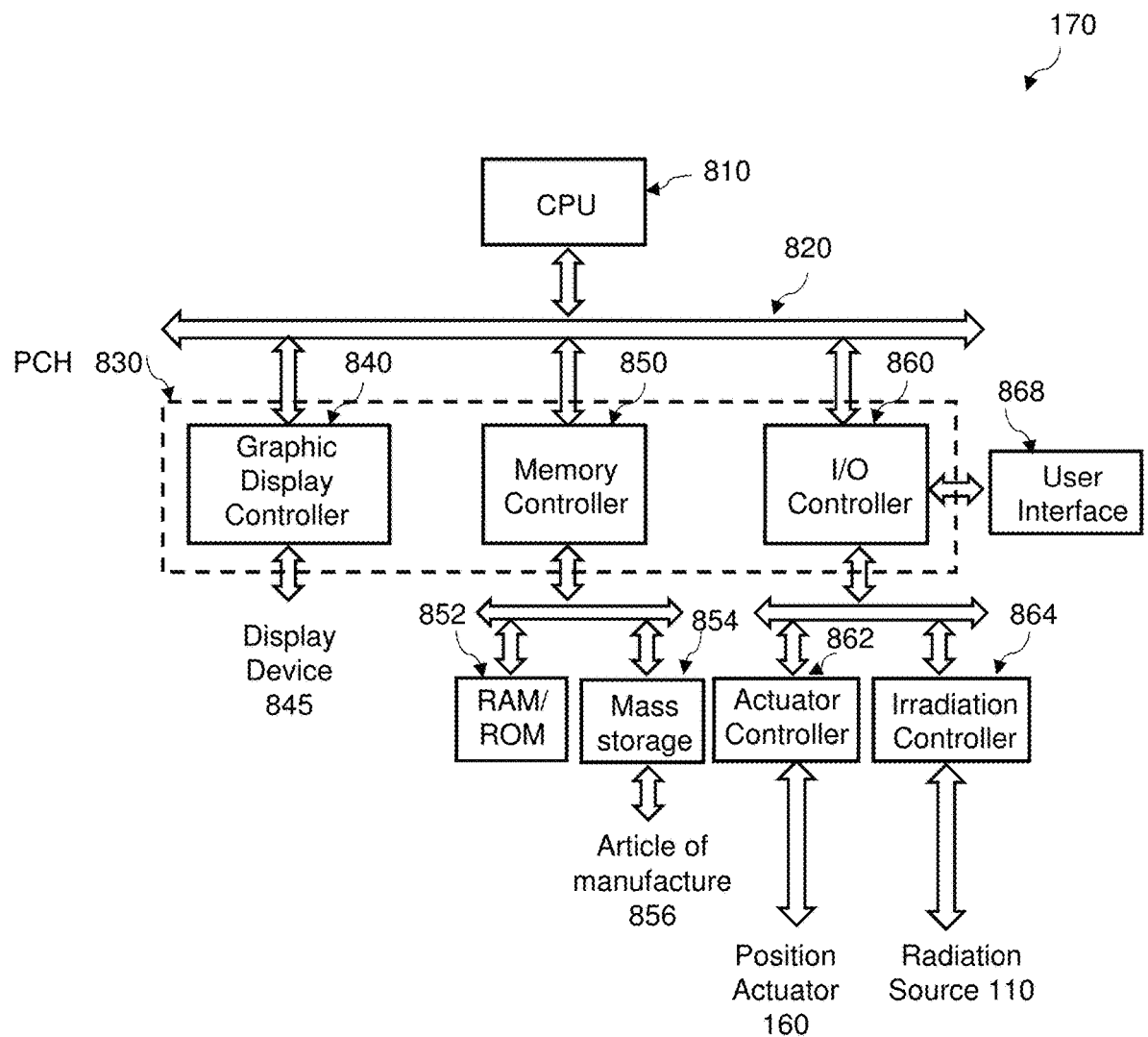
FIG. 8 is a diagram illustrating the controller.

FIG. 8 is a diagram illustrating the controller 170 shown in FIG. 1. The controller 170 includes a central processing unit (CPU) or a processor 810, a bus 820, and a platform controller hub (PCH) 830. The PCH 830 may include a graphic display controller (GDC) 840, a memory controller 850, an input/output (I/O) controller 860, and a mass storage controller 854. The processing and control system 170 may include more or less than the above components. In addition, a component may be integrated into another component. As shown in FIG. 8, all the controllers 840, 850, and 860 are integrated in the PCH 830. The integration may be partial and/or overlapped. For example, the GDC 840 may be integrated into the CPU 810, the I/O controller 860 and the memory controller 850 may be integrated into one single controller, etc.

The CPU or processor 810 is a programmable device that may execute a program or a collection of instructions to carry out a task. It may be a general-purpose processor, a digital signal processor, a programmable processor, a micro-controller, or a specially designed processor such as one design from Applications Specific Integrated Circuit (ASIC). It may include a single core or multiple cores. Each core may have multi-way multi-threading. The CPU 1010 may have simultaneous multithreading feature to further exploit the parallelism due to multiple threads across the multiple cores. In addition, the CPU 810 may have internal caches at multiple levels.

The bus 820 may be any suitable bus connecting the CPU 810 to other devices, including the PCH 830. For example, the bus 820 may be a Direct Media Interface (DMI).

The PCH 830 in a highly integrated chipset that includes many functionalities to provide interface to several devices such as memory devices, input/output devices, storage devices, network devices, etc.

The I/O controller 860 controls input devices (e.g., stylus, keyboard, and mouse, microphone, image sensor) and output devices (e.g., audio devices, speaker, scanner, printer). It also has interface to a network interface card which provides interface to a network and wireless controller (not shown).

The memory controller 850 controls memory devices such as the random access memory (RAM) and/or the read-only memory (ROM) 1052, and other types of memory such as the cache memory and flash memory. The RAM 852 may store instructions or programs, loaded from a mass storage device such as a non-transitory article of manufacture that contains the instructions or programs, that, when executed by the CPU 810, cause the CPU 810 to perform operations as described above. It may also store data used in the operations. The ROM 852 may include instructions, programs, constants, or data that are maintained whether it is powered or not. The instructions or programs may correspond to the functionalities described above, such as the frame cure control 170.

The GDC 840 controls a display device and provides graphical operations. It may be integrated inside the CPU 810. It typically has a graphical user interface (GUI) to allow interactions with a user who may send a command or activate a function. The GDC 840 may display, on the display device, images of the curing regions.

The mass storage controller 854 controls the mass storage devices such as CD-ROM and hard disk.

The I/O controller 860 may include an actuator controller 862 and an irradiation controller 864. The actuator controller 862 is configured to couple to the position actuator 160 (shown in FIG. 1). It may include switching circuits, drive circuits, and a micrometer drive. The micrometer drive may include a motorized actuator with micron, sub-micron, or sub-nano resolution. The irradiation controller. The irradiation controller 864 may include drive and timing circuits to control the radiation source 110.

Additional devices or bus interfaces may be available for interconnections and/or expansion. Some examples may include the Peripheral Component Interconnect Express (PCIe) bus, the Universal Serial Bus (USB), etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

The method or instructions that cause the processor to perform the operations described above may be stored on a non-transitory storage medium or article of manufacture such as an optical storage device.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising:
   a positional actuator attached to a digital spatial modulator (DSM) having a plurality of spatial elements with a pitch, and configured to move the DSM with a step size less than the pitch to provide a set of curing patterns for curing a photo-curable material in a desired curing region on a substrate; and
   a controller coupled to the position actuator to move the DSM with the step size in a predefined sequence that covers a first curing region and a second curing region such that a first curing dose accumulated at the first curing region exceeds a curing threshold while a second curing dose accumulated at the second curing region does not exceed the curing threshold,
   wherein the predefined sequence provides the set of curing patterns, and
   wherein the first curing region matches the desired curing region, and the second curing region does not match the desired curing region.

2. The apparatus according to claim 1, wherein the set of curing patterns includes curing patterns that are different from one another.

3. The apparatus according to claim 1, wherein one of the first and second curing doses is equal to a product of a curing intensity and a curing time.

4. The apparatus according to claim 1, wherein the predefined sequence is determined based on an optimization procedure that obtains the first and second curing regions having the first curing region with overlapped spatial elements in the plurality of spatial elements.

5. The apparatus according to claim 1, further comprising:
   an optical assembly arranged between a radiation source and the photo-curable material and configured to allow the radiation source to irradiate the photo-curable material based on the set of curing patterns.

6. The apparatus according to claim 5, wherein the optical assembly has a magnification factor such that the step size magnified by the magnification factor is less than a projected pitch.

7. The apparatus according to claim 1, wherein the predefined sequence includes a translation in at least one of a horizontal and a vertical directions.

8. The apparatus according to claim 1, wherein the magnification factor is adjusted by moving components of the optical assembly.

9. The apparatus according to claim 1, wherein the DSM is a digital micromirror device (DMD).

10. A method comprising:
  moving a position actuator, which is attached to a digital spatial modulator (DSM) having a plurality of spatial elements with a pitch with a step size less than the pitch in a predefined sequence that covers a first curing region and a second curing region; and
  irradiating a curing pattern to cure a photo-curable material such that a first curing dose accumulated at the first curing region exceeds a curing threshold while a second curing dose accumulated at the second curing region does not exceed the curing threshold,
  wherein the predefined sequence provides a set of curing patterns, and
  wherein the first curing region matches a desired curing region, and the second curing region does not match the desired curing region.

11. The method according to claim 10, wherein the set of curing patterns includes curing patterns that are different from one another.

12. The method according to claim 10, wherein one of the first and second curing doses is equal to a product of a curing intensity and a curing time.

13. The method according to claim 10, wherein the predefined sequence is determined based on an optimization procedure that obtains the first and second curing regions having the first curing region with overlapped spatial elements in the plurality of spatial elements.

14. The method according to claim 10, further comprising:
  allowing a radiation source to irradiate, through an optical assembly, the photo-curable material based on the pattern provided by the DSM.

15. The method according to claim 14, wherein the optical assembly has a magnification factor such that the step size magnified by the magnification factor is less than the pixel pitch.

16. A method for manufacturing articles using the method of according to claim 14 further comprising:
  processing a substrate on which the photo-curable material has been irradiated so as to manufacture the articles.

17. The method according to claim 10, wherein the predefined sequence includes a translation in at least one of a horizontal and a vertical directions.

18. The method according to claim 10, wherein the magnification factor is adjusted by moving components of the optical assembly.

19. The method according to claim 10, wherein the DSM is a digital micromirror device (DMD).

20. A system for imprint lithography, comprising:
  a radiation source; and
  a curing assembly between the radiation source and a photo-curable material, the curing assembly comprises:
    a positional actuator attached to a digital spatial modulator (DSM) having a plurality of spatial elements with a pitch, and configured to move the DSM with a step size less than the pitch to provide a set of curing patterns for curing a photo-curable material in a desired curing region on a substrate; and
    a controller coupled to the position actuator to move the DSM with the step size in a predefined sequence that covers a first curing region and a second curing region such that a first curing dose accumulated at the first curing region exceeds a curing threshold while a second curing dose accumulated at the second curing region does not exceed the curing threshold,
    wherein the predefined sequence provides the set of curing patterns, and
    wherein the first curing region matches the desired curing region, and the second curing region does not match the desired curing region.

21. The system according to claim 20, wherein set of curing patterns includes curing patterns that are different from one another.

22. The system according to claim 20, wherein the DSM is a digital micromirror device (DMD).

23. The system according to claim 20, wherein one of the first and second curing doses is equal to a product of a curing intensity and a curing time.

24. The system according to claim 20, wherein the predefined sequence is determined based on an optimization procedure that obtains the first and second curing regions having the first curing region with overlapped spatial elements in the plurality of spatial elements.

25. The system according to claim 20, wherein the curing assembly further comprises:
  an optical assembly configured to allow the radiation source to irradiate the photo-curable material based on the pattern provided by the DSM.

26. The system according to claim 25, wherein the optical assembly has a magnification factor such that the step size magnified by the magnification factor is less than the pitch.

27. The system according to claim 20, wherein the predefined sequence includes a translation in at least one of a horizontal and a vertical directions.

* * * * *